United States Patent
Choo et al.

(10) Patent No.: US 7,638,774 B2
(45) Date of Patent: Dec. 29, 2009

(54) ARRAY PANEL

(75) Inventors: Kyo-Seop Choo, Gyeonggi-do (KR); Jin Jeon, Gyeonggi-do (KR); Jun-Ho Song, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 710 days.

(21) Appl. No.: 10/550,480

(22) PCT Filed: Mar. 30, 2004

(86) PCT No.: PCT/KR2004/000718

§ 371 (c)(1),
(2), (4) Date: Sep. 23, 2005

(87) PCT Pub. No.: WO2004/090996

PCT Pub. Date: Oct. 21, 2004

(65) Prior Publication Data

US 2007/0096647 A1  May 3, 2007

(30) Foreign Application Priority Data

Apr. 7, 2003  (KR) .................. 10-2003-0021629

(51) Int. Cl.
 *H01L 31/115* (2006.01)
(52) U.S. Cl. ............................................... 250/370.09
(58) Field of Classification Search ............. 250/370.09
See application file for complete search history.

(56) References Cited

U.S. PATENT DOCUMENTS

| 5,300,784 | A | * | 4/1994 | Fender et al. ............ 250/484.2 |
| 6,075,248 | A | * | 6/2000 | Jeromin et al. ......... 250/370.09 |
| 2001/0049154 | A1 | * | 12/2001 | Choo et al. ................... 438/48 |
| 2002/0084419 | A1 | | 7/2002 | Choo et al. |
| 2002/0149318 | A1 | | 10/2002 | Jeon et al. |

(Continued)

FOREIGN PATENT DOCUMENTS

KR  1020030016758 A  3/2003

OTHER PUBLICATIONS

PCT Search Report corresponding to the related PCT/KR2004/000718 filed on Mar. 30, 2004.

*Primary Examiner*—David P Porta
*Assistant Examiner*—Shun Lee
(74) *Attorney, Agent, or Firm*—Innovation Counsel LLP

(57) ABSTRACT

An array panel for a digital X-ray detector including a gate driver (150) is disclosed. A switching element (TFT) is formed in a pixel region defined by gate (110) and data lines (120). A photoelectric cell (130) generates electrons in response to the light supplied from outward. A pixel electrode (260) is formed in the pixel region, and gathers electrons generated from the photoelectric cell (130). A storage capacitor (C) is connected to the drain electrode (225) and stores the electrons gathered in the pixel electrode (260). A gate driver (150) is electrically connected to an end portion of the gate line (110), and provides a scan signal for driving the switching element (TFT). A data pad (140) is electrically connected to an end portion of the data line (120). The electrons stored in the storage capacitor (C) move to the data pad (140) as the switching element (TFT) is turned on. Therefore, the manufacturing cost is reduced, and the manufacturing process is simplified.

11 Claims, 14 Drawing Sheets

U.S. PATENT DOCUMENTS

2002/0196898 A1* 12/2002 Kameshima ............... 378/98.8
2003/0038241 A1 2/2003 Choo et al.
2003/0043104 A1 3/2003 Lee et al.
2003/0075718 A1 4/2003 Jang et al.
2003/0222311 A1 12/2003 Kim

* cited by examiner

[Fig. 3]

ARRAY PANEL

CROSS-REFERENCE TO RELATED APPLICATION

This application is a national phase application of PCT/KR2004/000718 filed on Mar. 30, 2004, and claims priority thereto under 35 USC 371. PCT/KR2004/000718, in turn, claims priority from Korean Application No. 10-2003-0021629 filed on Apr. 7, 2003, the content of which is incorporated by reference herein in its entirety.

TECHNICAL FIELD

The present invention relates to an array panel for digital x-ray detector and method of manufacturing the array panel. More particularly, the present invention relates to an array panel for digital x-ray detector including a gate driving circuit, and a method of manufacturing the array panel.

BACKGROUND ART

Generally, the conventional diagnostic X-ray device takes an x-ray picture of an internal body for a patient on an X-ray sensitive film. The film needs some time to be printed for confirming the patient state. However, recent development in the semi-conductor technology makes the patient state recognized by the diagnostic X-ray device in real time without delay via a digital X-ray detector utilizing a thin film transistor (hereinafter, referred to as TFT) as a switching element. The digital x-ray detector has been researched until today.

Hereinafter, the structure and function of the digital X-ray detector is described as follows.

FIG. 1 is a schematic view illustrating the conventional digital X-ray detector.

Referring to FIG. 1, the conventional digital X-ray detector includes a substrate 1, a plurality of TFTs 3, a plurality of storage capacitors 10, and a plurality of pixel electrodes 12 disposed on the substrate 1, a light conductive layer 2 on the pixel electrodes 12, a protective layer 20, a conductive electrode 24, and a direct power source 26 of high voltage.

The light-conductive layer 2 generates an internal electric signal such as the stream of pairs of electron and hole 6 in proportion to an intensity of the external signal such as the electromagnetic wave incident thereon. Further, the light a conductive layer 2 also transforms an outer signal, for example, an X-ray, into an electrical signal.

The electron in the pair of electron and hole 6 is accumulated on the pixel electrode 12 disposed below the light conductive layer 2 by a predetermined voltage E of the conductive electrode 24 applied from the direct power source 26, and is stored in the storage capacitor 10 formed with a common electrode that is connected to the ground. The TFTs 3 move the electrons stored in the storage capacitor 10 to an image-processing device in an outside of the detector 100 to thereby form an X-ray image.

DISCLOSURE OF INVENTION

Technical Problem

Accordingly, the present invention has been made to solve the aforementioned disadvantages of the conventional digital X-ray detector, and provides an array panel for the digital X-ray detector in which a gate driver is built.

The present invention also provides a manufacturing method of the array panel.

Technical Solutions

According to an exemplary embodiment of the present invention, an array panel for the digital X-ray detector comprises an array portion formed on a first region of a substrate and a gate-driving portion formed on a second region of the substrate. The array portion accumulates and stores electrons generated in accordance with light supplied from outside, and the gate-driving portion applies a scanning signal for extracting the electrons to the array portion.

According to another exemplary embodiment of the present invention, an array panel for the digital X-ray detector comprises a substrate, a gate line extending on the substrate in a first direction, a data line extending on the substrate in a second direction, a switching element including a gate electrode, a source electrode, and a drain electrode, a photoelectric cell for generating electrons in proportion with the intensity of light supplied from outside, thereby generating an electrical signal, a pixel electrode formed in the pixel region, a storage capacitor formed in the pixel region, a gate driver making electrically contact with an end portion of the gate line on the substrate, and a data pad making electrically contact with an end portion of the data line on the substrate. The switching element is formed in a pixel region defined by the gate and data lines, and the pixel electrode gathers electrons generated from the photoelectric cell. The storage capacitor stores the electrons gathered by the pixel electrode. The gate driver sequentially provides a scan signal for driving the switching element, and the electrons stored in the storage capacitor are extracted to the data pad through the switching element in case that the switching element is turned on.

According to still another exemplary embodiment of the present invention, an array panel for the digital X-ray detector is manufactured as follows. A first switching element and a second switching element, a first Inductive line for a data pad and a second Inductive line for a storage capacitor are formed first, and a first transparent electrode is formed on the first and second conductive lines. The first switching element corresponds to a pixel region of a substrate. Then, an insulating layer and an organic layer are sequentially coated on the first transparent electrode, and the organic layer corresponding to the first and second conductive lines and a drain electrode of the first switching element is partially and selectively removed. A second transparent electrode for collecting electrons is formed, and is electrically connected to the data pad and the drain electrode. Furthermore, a protecting layer may be formed on the exposed organic layer and the second transparent layer, and a light conductive semiconductor layer may be formed on the protecting layer. An electrode may also be formed on the light conductive semiconductor layer.

With the above exemplary embodiments, the gate driver, which generates a scan signal for extracting electrons stored in the storage capacitor according to an image signal, is formed on the same substrate where the array portion of an X-ray detector is formed. Therefore, the manufacturing cost is reduced, and the manufacturing process is simplified.

DESCRIPTION OF DRAWINGS

The above and other advantages of the present invention will become readily apparent by reference to the following detailed description when considered in conjunction with the accompanying drawings wherein.

BEST MODE

Hereinafter, the best mode of the present invention will be described in detail with reference to the accompanying drawings.

Figure 1:
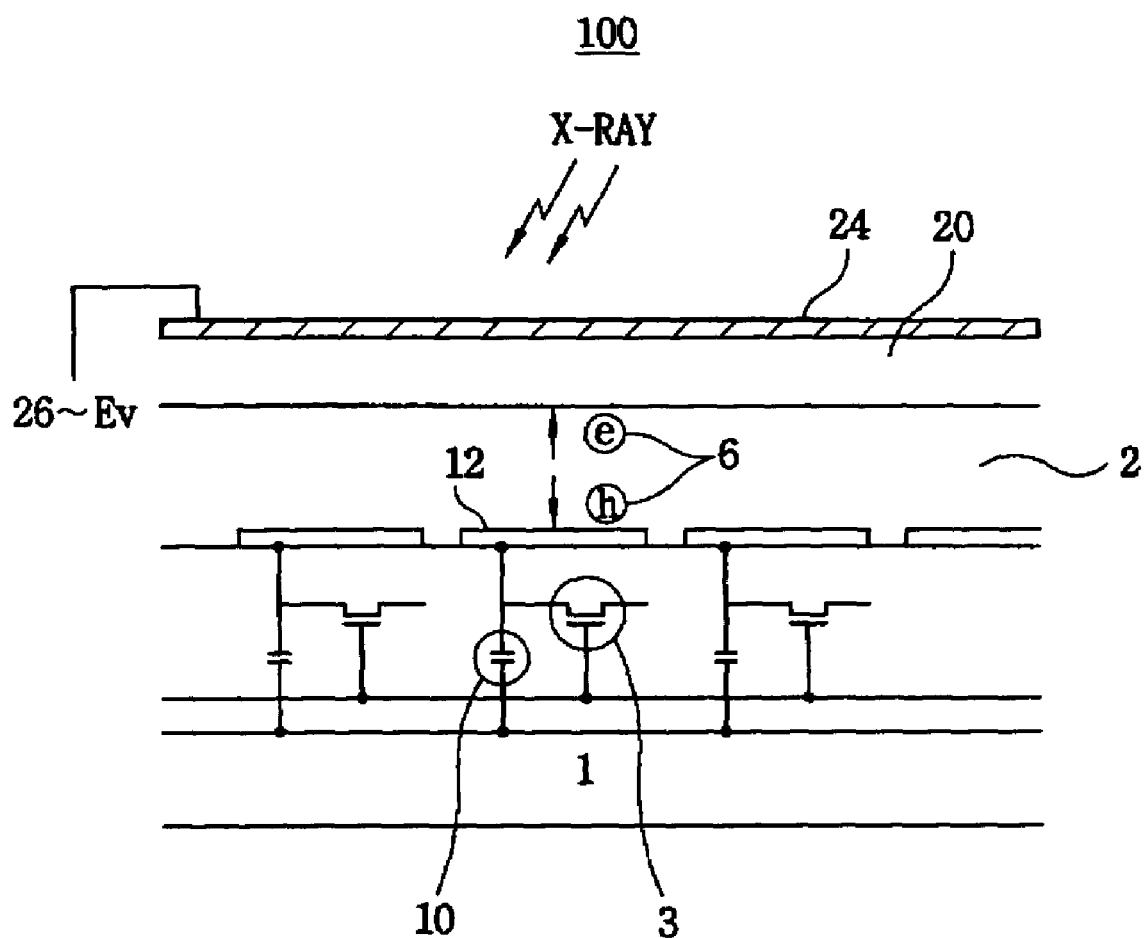
FIG. 1 is a schematic view illustrating the conventional digital X-ray detector.
Figure 2:
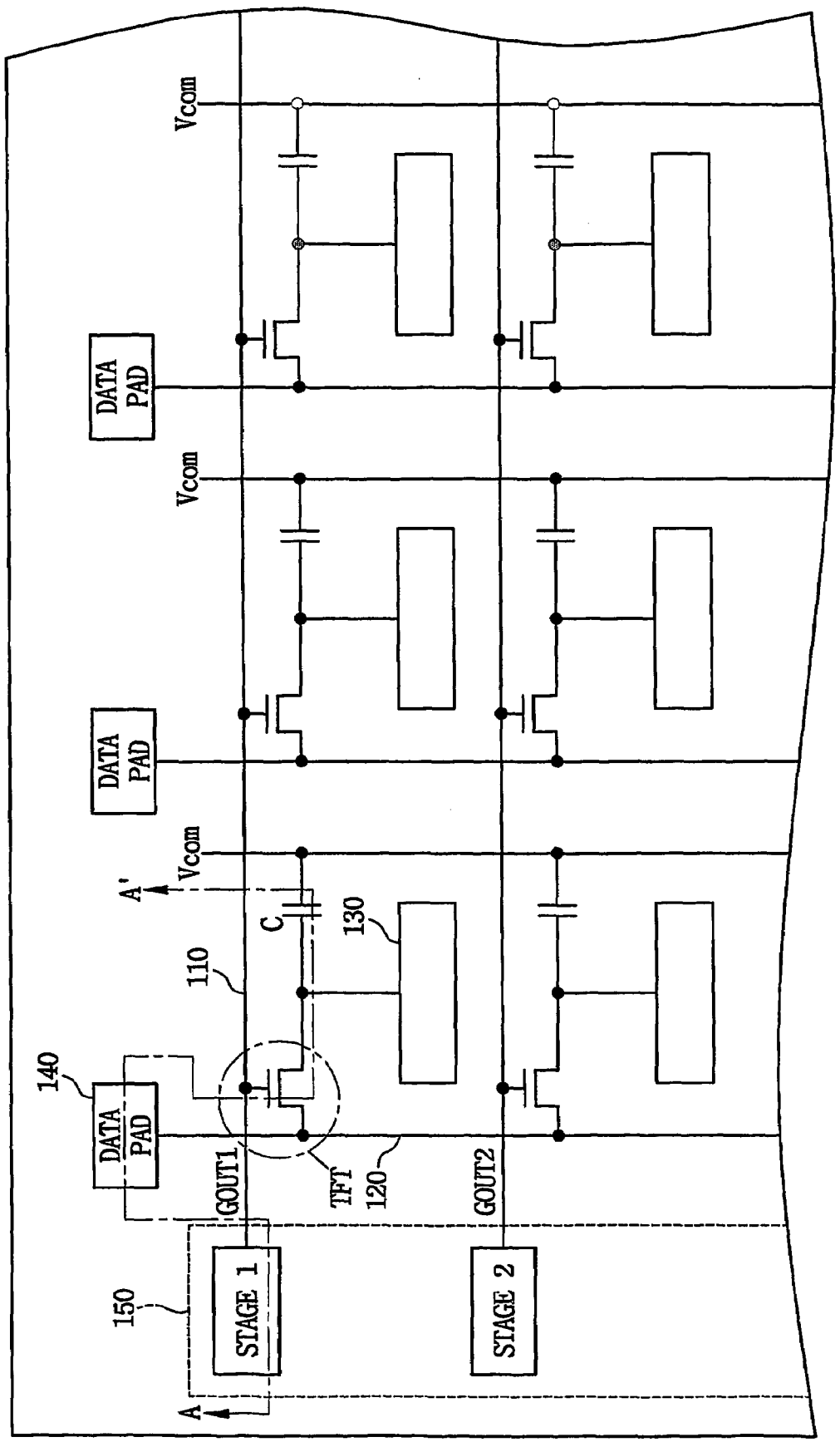
FIG. 2 is a schematic view illustrating an array panel for the digital X-ray detector according to an exemplary embodiment of the present invention.

FIG. 2 is a schematic view illustrating an array panel for the digital X-ray detector according to an exemplary embodiment of the present invention.

Referring to FIG. 2, the array panel for the digital X-ray detector of the present invention includes a plurality of gate lines 110 extending in a first direction such as a longitudinal direction and a plurality of data lines 120 extending in a second direction substantially perpendicular to the first direction such as a latitudinal direction. The gate and data lines 110 and 120 define a plurality of pixel regions on the array panel. Each pixel region includes a switching element such as a thin film transistor (TFT), a photoelectric cell 130 connected to a drain electrode of the TFT, a storage capacitor C formed between the drain electrode and a common electrode $V_{com}$. A data pad 140 is formed at end portion of the data line 120, and a gate driver 150 is connected to the gate line 110. As an exemplary embodiment, the data pad 140 and the gate driver 150 are formed on the same substrate on which the gate and data lines 110 and 120 are formed. Further, a ground voltage is applied to the common electrode $V_{com}$ so as for the common electrode $V_{com}$ to fully remove the remaining electrons from the storage capacitor C when the electrons charged in the storage capacitor C are not completely discharged through the data pad 140.

The photoelectric cell 130 generates electrons in proportion with the intensity of light supplied from outside, and stores the electrons into the storage capacitor C.

When a scan signal for discharging the electrons from the storage capacitor C is transmitted from the gate driver 150 to the TFT, the TFT is turned on and the electrons are discharged through the drain and source electrode to the data pad 140. That is, when the scan signal is applied to the TFT, the electrons in the storage capacitor C are discharged to outside through the medium of the data pad 140.

Figure 3:
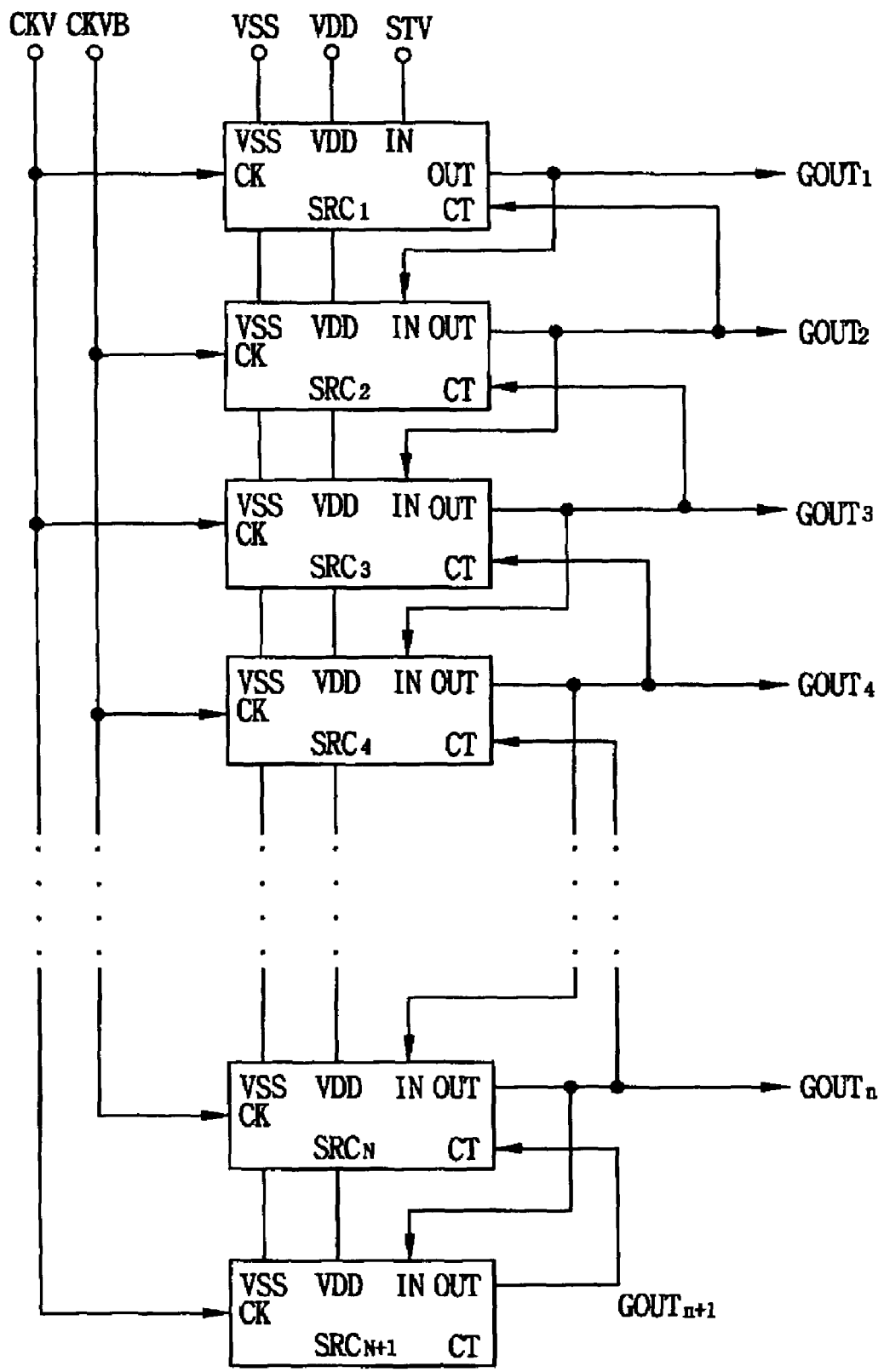
FIG. 3 is a schematic view describing the gate driver shown in FIG. 2.

FIG. 3 is a schematic view describing the gate driver shown in FIG. 2.

Referring to FIG. 3, the gate driver 150 that functions as a shift register clock includes a plurality of stages $SRC_1$, $SRC_2$, ..., and $SRC_n$ corresponding to the gate lines, respectively, and a dummy stage $SRC_{n+1}$. An each stage includes an input terminal IN, an output terminal OUT, a control terminal CT, a clock input terminal CK, a first voltage terminal VSS and a second voltage terminal VDD.

A scan start signal STV is transmitted to the input terminal IN of the first stage $SRC_1$. The scan start signal STV is a pulse synchronized with a vertical synchronizing signal $V_{sync}$.

Each of output signals $GOUT_1$, $GOUT_2$, ..., and $GOUT_n$ of the stages is transmitted to the corresponding gate line 110, respectively. A first clock signal CKV is transmitted to odd-numbered stages $SRC_1$, $SRC_3$, ..., and SRC , and a second clock signal CKVB is transmitted to even-numbered stages $SRC_2$, $SRC_4$, ..., and $SRC_{2n}$. The first clock signal CKV has a phase opposite to that of the second clock signal CKVB. Therefore, a duty period of the first and second clock signals CKV and CKVB becomes 16.6/Nms. A duty period of the shift register clock of a gate driving circuit is above about 8 times a duty period of the shift register clock of a data driving circuit.

Each control terminal CT of the stages $SRC_1$, $SRC_2$, ..., and SRC accepts the output signals $GOUT_2$, $GOUT_3$, ..., and $GOUT_{n+1}$ of the next stages $SRC_2$, $SRC_3$, ..., and $SRC_{n+1}$ as a control signal. That is, the control signal inputted to the control terminal CT is delayed as much as the duty period thereof.

As a result, the output signal of each stage is sequentially generated as an active state that is a high signal, thus the gate line corresponding to the active state of each output signal is activated.

Figure 4:
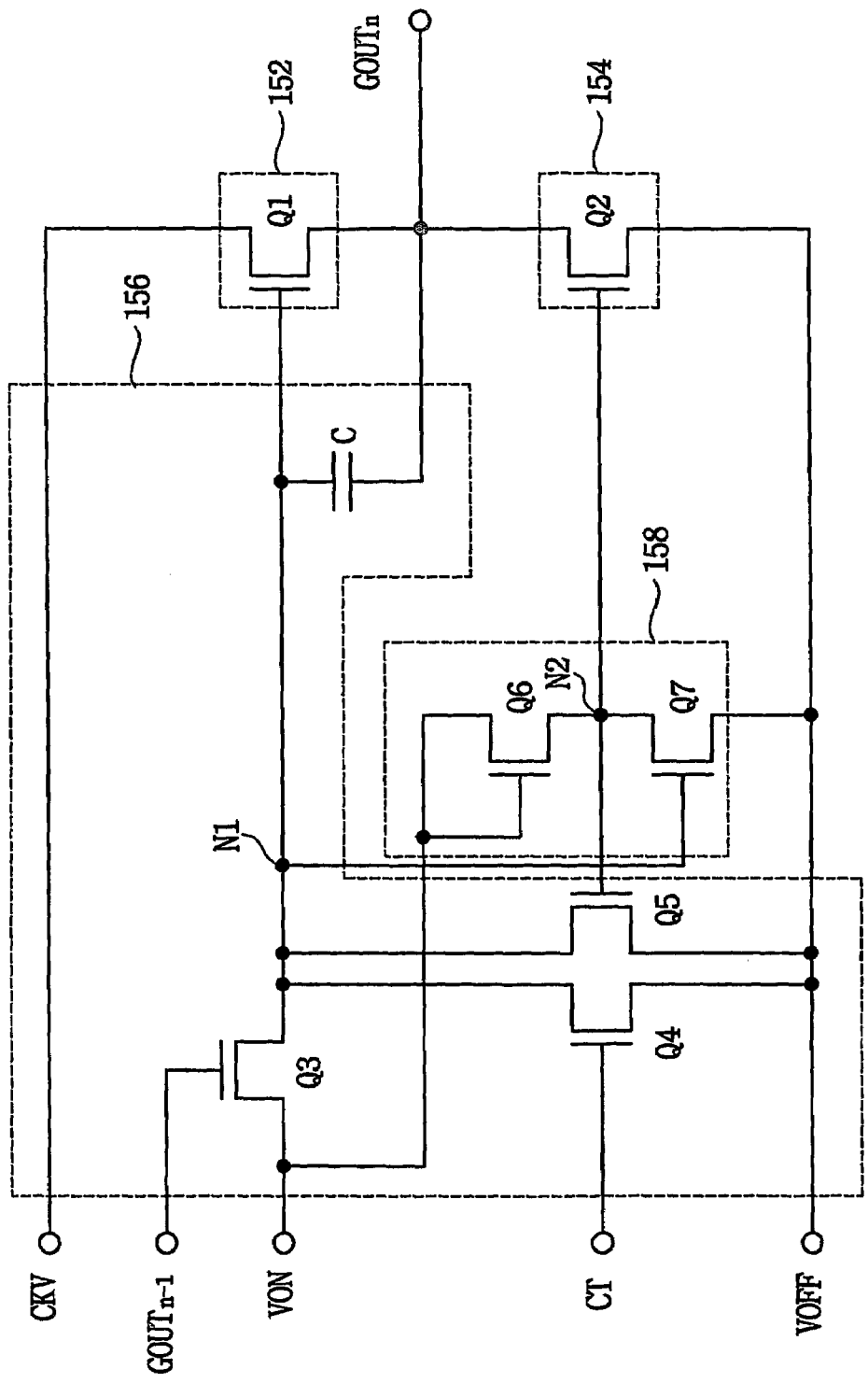
FIG. 4 is a schematic view illustrating the unit stage shown in FIG. 3.

FIG. 4 is a schematic view illustrating the unit stage shown in FIG. 3.

Referring to FIG. 4, the stage includes a pull-up portion 152, a pull-down portion 154, a pull-up driver 156 and a pull-down driver 158.

As an exemplary embodiment, the pull-up portion 152 is a first NMOS transistor Q1 including a drain electrode connected to the clock input terminal CK, a gate electrode connected to a first node N1, and a source electrode connected to the output terminal $OUT_n$. The pull-down portion 154 is a second NMOS transistor Q2 including a drain electrode connected to the output terminal $OUT_n$, a gate electrode connected to a second node N2, and a source electrode to which the first voltage terminal VSS is applied.

The pull-up driver 156 includes a capacitor C and a plurality of transistors. In detail, the capacitor C is electrically connected to both the first node $N_1$ and the output terminal $OUT_n$. A third NMOS transistor Q3 includes a drain electrode to which a turn-on voltage $V_{com}$ is applied, a gate electrode connected to the input terminal IN to which the output signal $GOUT_{n-1}$ outputted from the previous stage is transmitted, and a source electrode connected to the first node $N_1$. A fourth NMOS transistor Q4 includes a drain electrode connected to the first node $N_1$, a gate electrode connected to the second node $N_2$, and a source electrode to which a turn-off voltage $V_{off}$ is applied. A fifth transistor Q5 also includes a drain electrode connected to the first node $N_1$, a gate electrode connected to the second node $N_2$, and a source electrode to which a turn-off voltage $V_{off}$ is applied. The size of the third NMOS transistor Q3 is about two times the size of the fifth NMOS transistor Q5.

The pull-down driver 158 includes a sixth NMOS transistor Q6 and seventh NMOS transistor Q7. The sixth NMOS transistor Q6 includes a drain electrode and a gate electrode to which the turn-on voltage $V_{on}$ is commonly applied, and a source electrode connected to the second node $N_2$. The seventh NMOS transistor Q6 includes a drain electrode connected to the second node $N_2$, a gate electrode connected to the second node $N_1$, and a source electrode to which the turn-off voltage $V_{off}$ is applied. The size of the sixth NMOS transistor Q6 is about 16 times the size of the seventh NMOS transistor Q7.

When the first and second clock signals CKV and CKVB and the scan start signal STV are transmitted to the gate driver that is a kind of the shift register, the first stage $SRC_1$ generates the first output signal $GOUT_1$ through the output terminal OUT by delaying high level state of the first clock signal CKV in accordance with the scan start signal STV.

As described above, the first and second clock signals CKV and CKVB are transmitted to the shift register of the array panel of the digital X-ray detector with the scan start signal STV, so that the shift register functions as the gate driver of the array panel.

Figure 5:
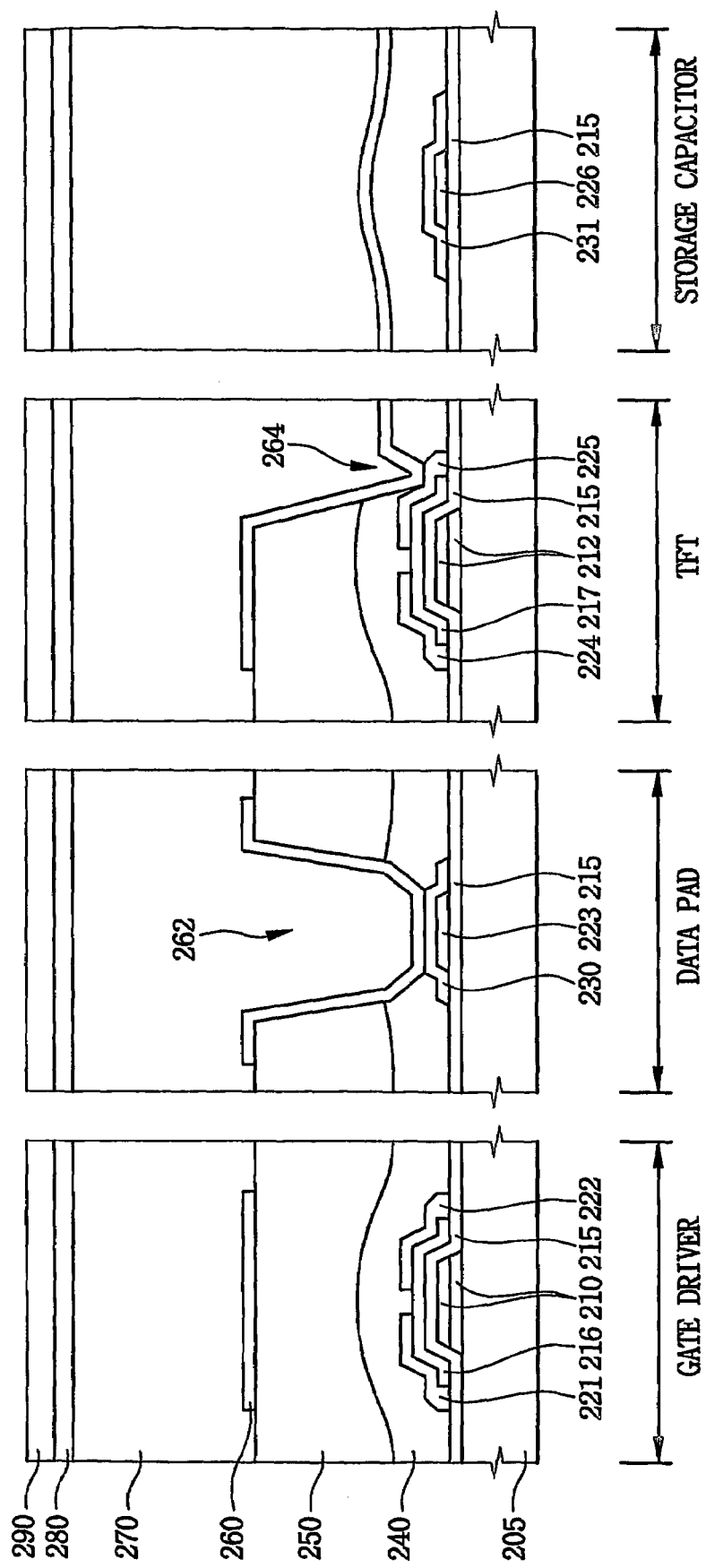
FIG. 5 is a cross sectional view taken along the line A-A' of FIG. 2.

FIG. 5 is a cross sectional view taken along the line A-A' of FIG. 2. FIG. 5 shows the gate driver, the data pad, the TFT, and the storage capacitor of the array panel in detail.

Referring to FIGS. 2 and 5, a plurality of pixel regions is defined on a substrate 205 by the plurality of gate and data lines. Each pixel region includes a TFT as a switching element and a storage capacitor C. The gate driver 150 for turning on the TFT and the data pad 140 for discharging the electrons charged in the storage capacitor C are formed on the same substrate on where the TFT and the storage capacitor C are formed. Subsequently, an insulating layer 240, an organic layer 250, and a pixel electrode 260 for collecting the electrons comprising indium tin oxide (ITO) are sequentially coated to thereby form the array substrate for the digital X-ray detector.

In further detail, the gate driver 150 is an amorphous silicon transistor including a gate electrode 210, a gate-insulating layer 215, a semiconductor layer 216, and source/drain electrodes 221 and 222 sequentially stacked on the substrate 205. The gate-insulating layer 215 comprises a silicon oxide or a silicon nitride, and the semiconductor layer 216 includes intrinsic semiconductor and impurity semiconductor continuously and sequentially deposited on the gate-insulating layer 215. The gate driver 150 generates a scan signal for turning on the TFT. All of the transistors in the gate driver 150 and the TFT for an exemplary embodiment are amorphous silicon transistor.

As described above with reference to FIGS. 3 and 4, the gate driver 150 requires at least as many stages as the number of the gate lines and a plurality of transistors formed in a stage, thus the gate driver has many good transistors. FIG. 5 shows, however, single amorphous silicon transistor for convenience.

The insulating layer 240 and the organic layer 250 are sequentially coated on the amorphous silicon transistor. A pixel electrode 260 including a second ITO layer is coated on the organic layer 250 for covering the whole amorphous silicon transistor and collecting the electrons. In an exemplary embodiment, the organic layer 250 comprises polycarbonate or photoacryl. The organic layer 250 allows the data pad 140 or the drain electrode 225 of the TFT to be exposed just through the exposure and development processes without an additional etching process, and also allows an organic layer on the storage capacitor to be completely removed.

The data line is formed on a data pad region of the substrate 205, and a first ITO layer is formed on the data line 230. The first and second ITO layers 230 and 260 make an electrical contact with each other through a contact hole 262. The insulating layer 240 and the organic layer 250 are partially removed, and the second ITO layer 260 makes contact simultaneously with the insulating layer 240, the organic layer 250 and the first ITO layer 230 in the contact hole.

In an exemplary embodiment, the TFT is an amorphous silicon transistor including a gate electrode 212, a gate-insulating layer 215, a semiconductor layer 217, and source/drain electrodes 224 and 225 sequentially stacked on the substrate 205. The gate-insulating layer 215 comprises a silicon oxide or a silicon nitride, and the semiconductor layer 216 includes intrinsic semiconductor and impurity semiconductor continuously and sequentially deposited on the gate-insulating layer 215. The gate driver 150 generates a scan signal for turning on the TFT. In accordance with an exemplary embodiment of the present invention, all of the transistors in the gate driver 150 and the TFT are amorphous silicon transistor. The TFT is turned on in accordance with the scan signal transmitted to the gate electrode 212 thereof, and thus the electrons stored in the storage capacitor C connected to the drain electrode 225 are charged to the data pad 140 through the source electrode 224.

The storage capacitor C includes a capacitor electrode 226 formed on the gate-insulating layer 215 and the pixel electrode 260, i.e. the second ITO layer, and the insulating layer 240 and the organic layer 250 are interposed between the capacitor electrode 226 and the second ITO layer 260.

The pixel electrode 260 extends to an upper portion of the TFT, and collects the electrons generated from a light conductive layer, so that holes from a light conductive layer are accumulated into the storage capacitor C.

The pixel electrode 260 makes a contact electrically with the drain electrode 225 through a drain contact hole 264 so that the hole stored in the storage capacitor (C) may combine with the electron supplied by the TFT.

A protecting layer 270 is formed on the array substrate, and a light conductive semiconductor layer 280 (130 in FIG. 2) is formed on the protecting layer 270. An electrode 290 is formed on the light conductive semiconductor layer 280, thereby completing a formation of the digital X-ray detector according to the present invention.

Hereinafter, the method of manufacturing the array panel for the digital X-ray detector will be described in detail with reference to FIGS. 6 to 14. FIGS. 6 to 14 are views illustrating process steps of the array panel for the digital X-ray detector according to an embodiment of the present invention.

Figure 6:
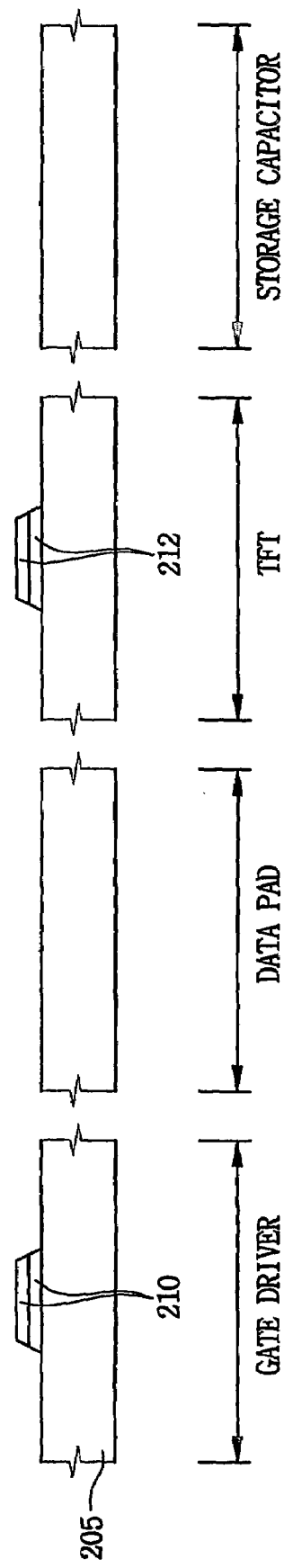
FIGS. 6 to 14 are views illustrating process steps of the array panel for the digital X-ray detector according to an embodiment of the present invention.

As shown in FIG. 6, a dual metal layer 210 is coated on a gate drive region and a TFT region of the substrate 205, so as to form the gate lines. According to an exemplary embodiment, aluminum (Al) is first deposited on the substrate 205, and chromium (Cr) or molybdenum (Mo) is deposited on the aluminum layer. Although the above exemplary embodiment discloses the gate electrode formed into the dual metal layer in FIG. 6, a single metal layer such as aluminum (Al) layer or any other configuration known to one of the ordinary skill in the art may also be utilized in place of or in conjunction with the dual metal layer.

Figure 7:
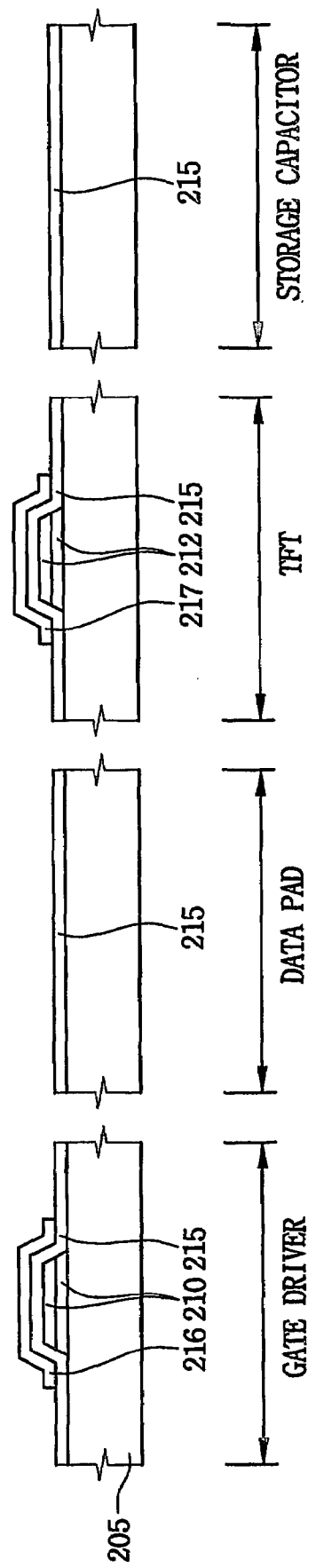

As shown in FIG. 7, an insulating material such as a silicon oxide or a silicon nitride is deposited on a whole surface of the substrate 205 on which the dual metal layer is formed, and intrinsic semiconductor and impurity semiconductor are continuously deposited on the insulating layer. Then, the insulating material, the intrinsic semiconductor and the impurity semiconductor are etched. Thus, an insulating layer 215 is formed covering a whole surface of the substrate 205, a first semiconductor layer 216 of intrinsic and impurity semiconductor is formed on the gate drive region, and a second semiconductor layer 217 of intrinsic and impurity semiconductor is formed on the TFT region. As a result, the gate-insulating layer 215 covers the whole gate electrode 210, and the first and second semiconductor layers 216 and 217 are formed on the gate-insulating layer 215.

Figure 8:
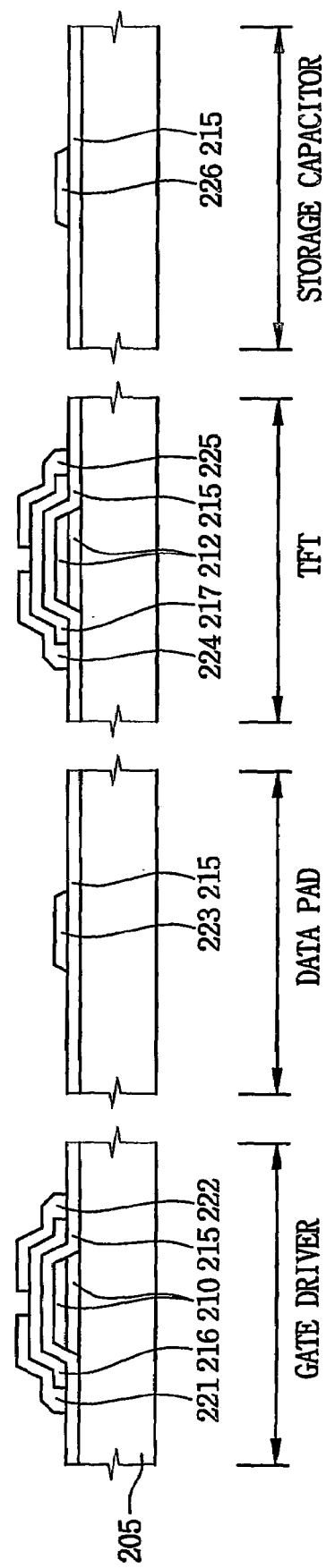

Referring to FIG. 8, a metal such as chromium (Cr) or a chromium (Cr) alloy is deposited on a whole surface of the resultant substrate as shown in FIG. 7, and an etching process is selectively performed. Therefore, a first source and drain electrodes 221 and 222 are formed on the gate drive region, and a second source and drain electrodes 224 and 225 are formed on the TFT region. In addition, metal lines 223 and 226 are formed on the data pad region and storage region, respectively.

Figure 9:
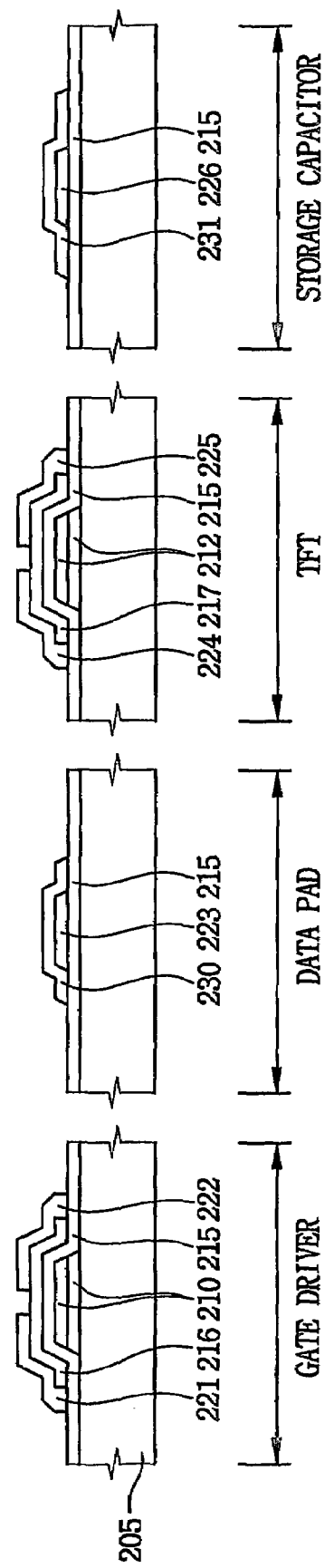

Referring to FIG. 9, ITO materials 230 and 231 are deposited on the data pad region and the storage region of the resultant substrate as shown in FIG. 8, respectively, so as to refresh the electrons accumulated by the photoelectric cell such as light conductive layer. A tin oxide (TO) layer or an indium zinc oxide (IZO) layer may be utilized in place of or in conjunction with the ITO layer.

Figure 10:
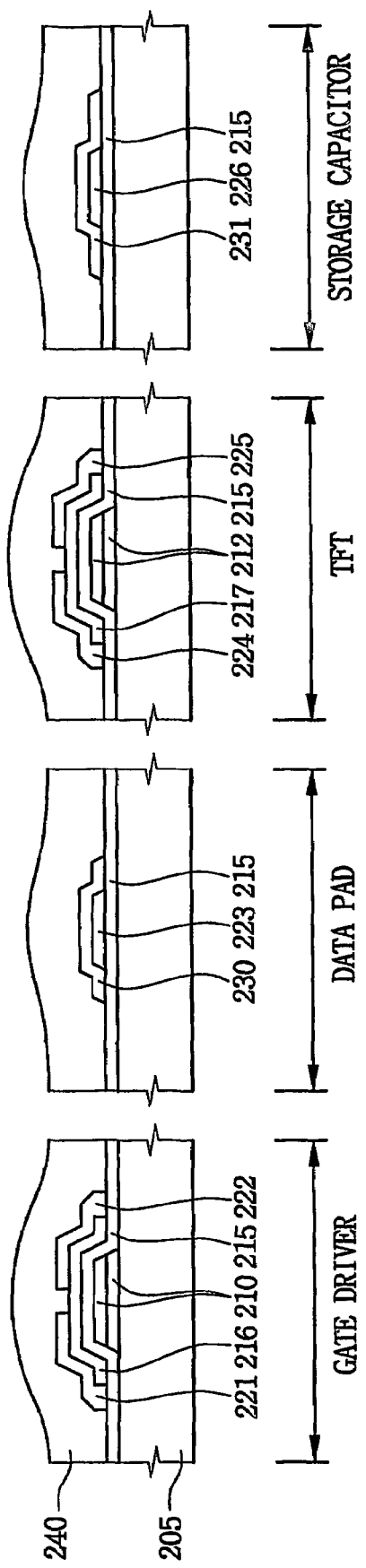

Referring to FIG. 10, a silicon nitride (SiNx) layer 240 is formed on a surface of the resultant substrate as shown in FIG. 9 without performing the exposure or etching process so as to electrically insulate the storage capacitor. Therefore, the silicon nitride (SiNx) layer 240 prevents a channel region of the TFT from making a contact electrically with an organic layer formed in a subsequent process, thus the current of the amorphous silicon transistor may be stabilized.

Figure 11:
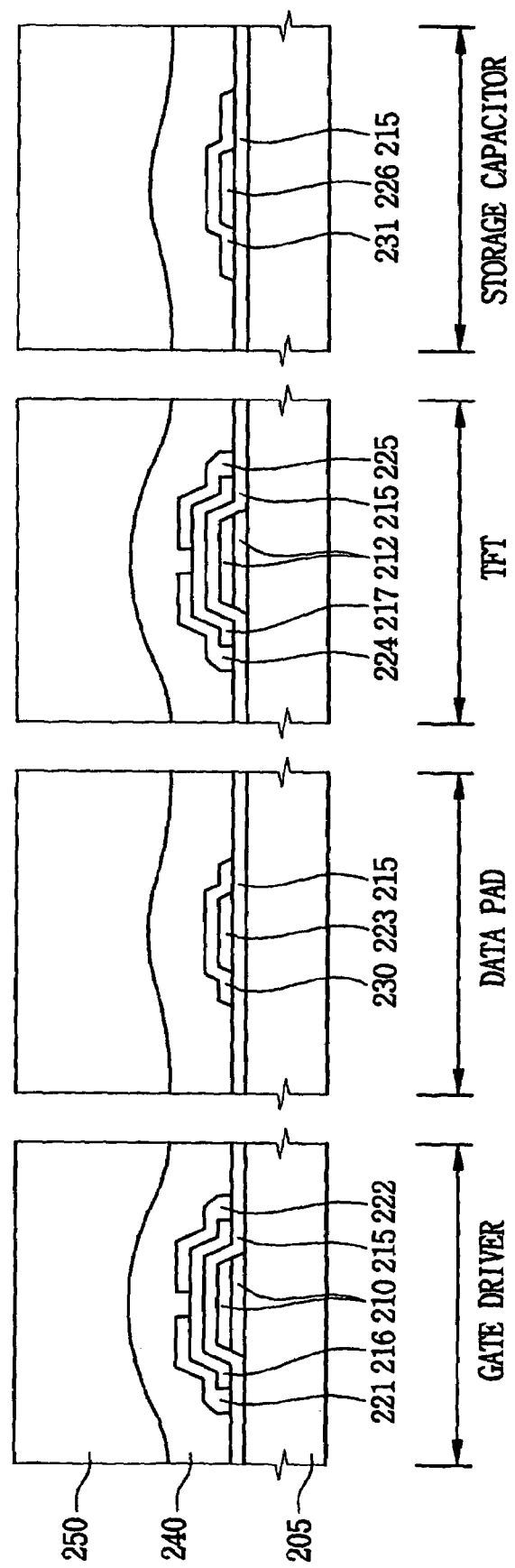

Referring to FIG. 11, the organic layer 250 is formed on the resultant substrate covering its whole surface as shown in FIG. 10. According to an exemplary embodiment of the present invention, the organic layer 250 comprises a light-sensitive organic material for simplifying the manufacturing process of the array panel. While the conventional organic material such as benzo caclo butene (BCB) requires a dry etching process for manufacturing the array panel for the digital X-ray detector, the light-sensitive organic material does not require etching process, thus the pattern may be formed on the organic layer 250 of the present invention just through the exposure and development processes, thereby simplifying the manufacturing process of the array panel. In addition, the organic layer 250 may be utilized as a passivation layer, so that a high aperture ratio structure may be applied thereon. Further, the organic has an advantage that a fill factor may be improved above about 85% by maximizing a surface of an electron-collecting electrode formed by in a subsequent process.

Figure 12:
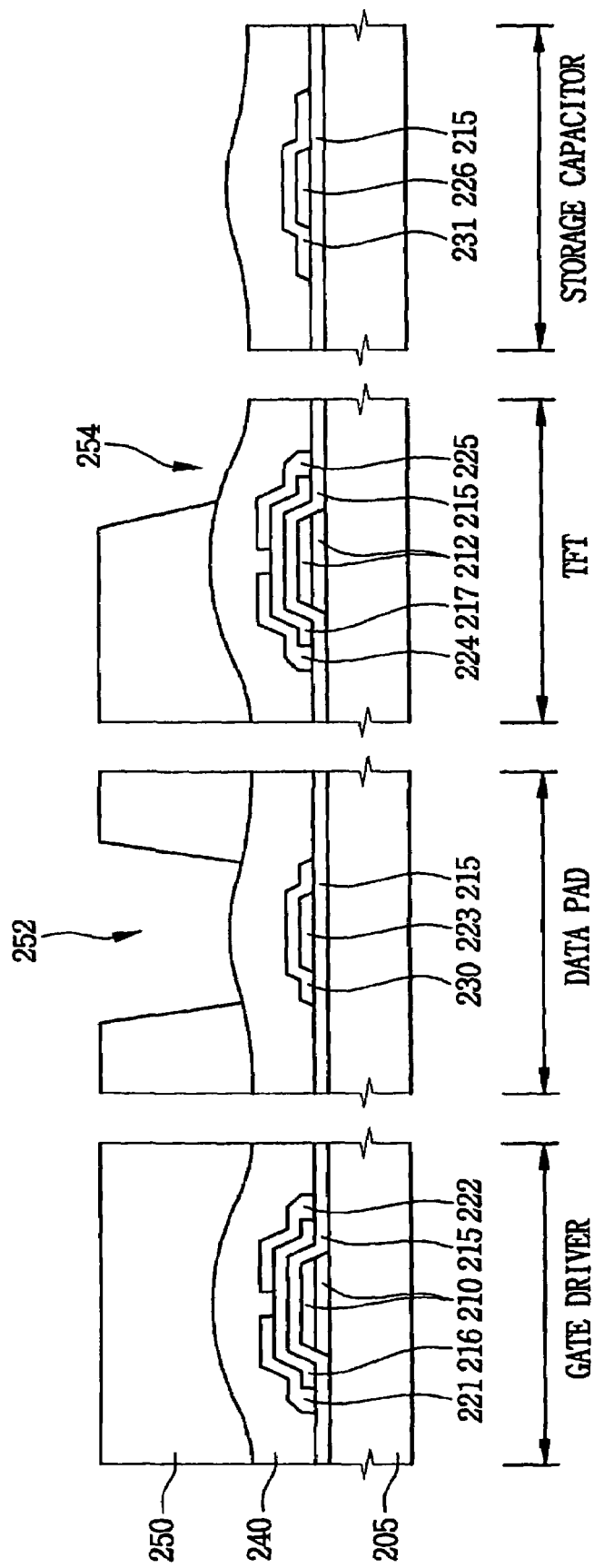

Referring to FIG. 12, the organic layer 250 is partially removed by the exposure and development processes, so that the organic layer corresponding to the data pad region and the drain region of the TFT is opened to form via holes 252 and 254.

Figure 13:
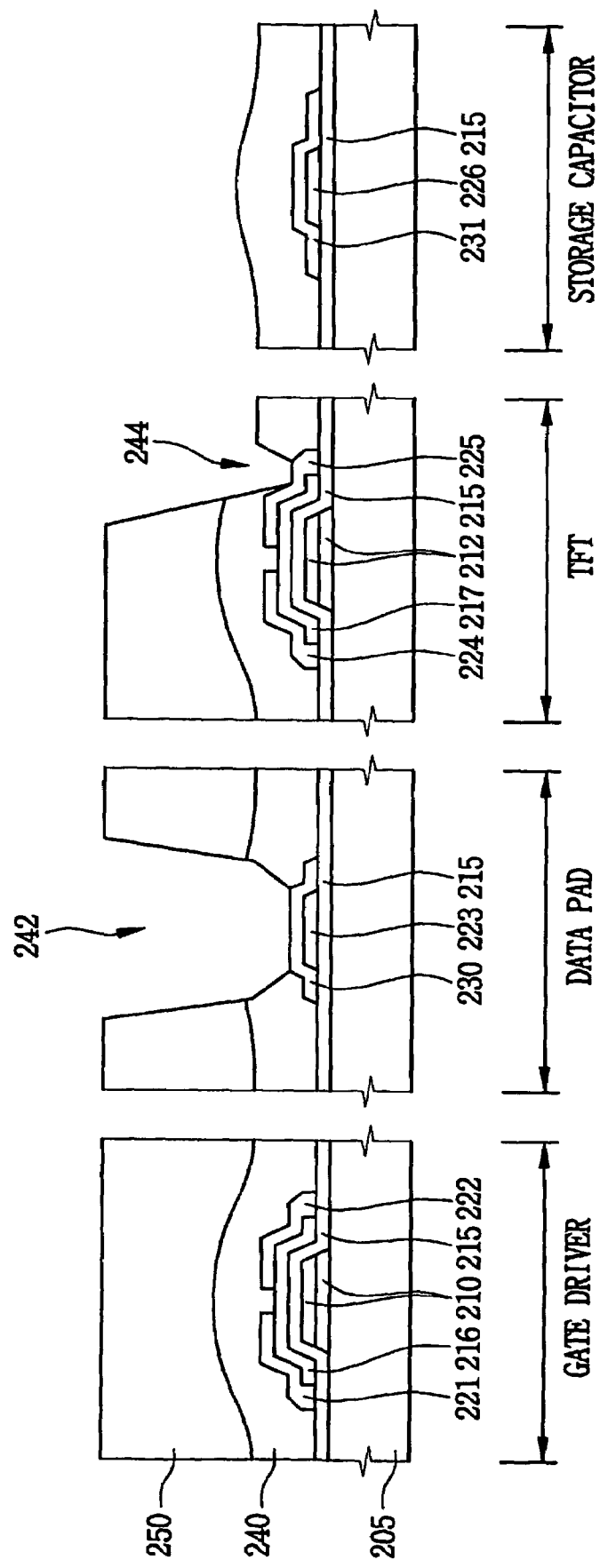

Referring to FIG. 13, the silicon nitride layer 240 corresponding to the data pad region and the drain region of the TFT is removed and opened by etching process on the resultant substrate as shown in FIG. 12, so that the data pad and the drain electrode of the TFT are exposed through the via holes 242 and 244, respectively.

Figure 14:
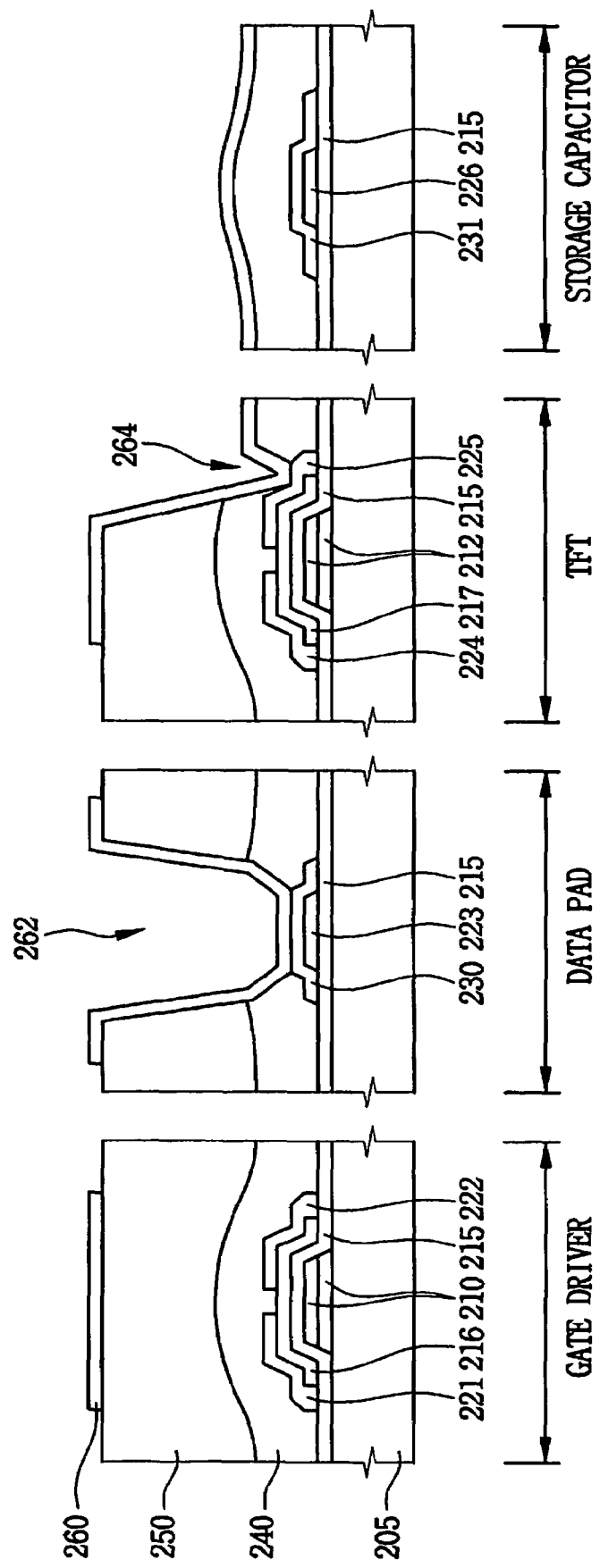

Referring to FIG. 14, the ITO is deposited on a whole surface of the resultant substrate as shown in FIG. 13 for collecting electrons, and selectively etched away.

Therefore, the ITO layer 260 is formed just on the data driver region, the data pad region, the TFT region and the storage capacitor region. According to an exemplary embodiment of the present invention, the surface of the ITO layer is maximized so as to form the array panel having the high aperture ratio structure by collecting electrons more abundantly when the organic layer 250 is utilized as the passivation layer of the array panel. Particularly, the ITO layer 260 is formed to cover the whole TFT and the gate driver, so that the electrons generated by the X-ray are prevented from inducing the off current in the switching element or the gate driver.

Subsequently, the protecting layer 270 is formed on a whole surface of the resultant substrate as shown in FIG. 14, and then a light conductive semiconductor layer 280 such as amorphous selenium (a-Se) is formed on the protecting layer 270. Finally, an electrode 290 is formed on the light conductive semiconductor layer 280 to thereby complete the array panel of the digital X-ray detector as shown in FIG. 5. The light conductive semiconductor layer 280 may be formed on a whole surface of the protecting layer 270 or on partial surfaces of the protecting layer 270 corresponding to each pixel region of the array panel.

Although the above exemplary embodiment discloses the organic layer comprising the light sensitive organic material, any other material known to one of the ordinary skill in the art as the organic layer corresponding to the data pad region and the drain electrode of the TFT is removed without performing the exposure and development processes may also be utilized in place of the organic layer comprising the light sensitive organic material.

INDUSTRIAL APPLICABILITY

As mentioned above, the gate driver for providing a scan signal is installed on the same substrate on which the array panel of the digital X-ray detector is formed, so that the manufacturing cost is reduced and a design margin is sufficiently guaranteed. That is, the gate driver of the present invention providing the scan signal for obtaining an image from the array panel may not needed to be installed with a supplementary such as a tape carrier package (TCP) or a chip on glass (COG), so that the manufacturing cost is reduced at least as much as the cost of the TCP or COG, and the design margin may also be obtained at least as large as the surface that is occupied by the TCP or COG. In addition, the gate driver is formed during the manufacturing the array panel, so that the manufacturing process for the gate driver may be omitted, and a number of the manufacturing processes for the array panel is reduced.

A light sensitive organic material such as polycarbonate and photoacryl is deposited on the gate driver and the switching element, and thus the gate driver and the switching element may be exposed just by exposure and development processes without the etching process. Therefore, the present invention advantageously simplifies the manufacturing process for the array panel. In addition, the organic layer may function as a passivation layer of the array panel, and thus the surface of the pixel electrode is maximized so as to form the array panel having the high aperture ratio structure by collecting electrons more in abundant.

Although the exemplary embodiments of the present invention have been described, it is understood that the present invention should not be limited to these exemplary embodiments, but various changes and modifications can be made by one ordinary skilled in the art within the scope of the present invention as hereinafter claimed.

The invention claimed is:

1. An array panel comprising:
a substrate including a gate driver region, a data pad region, and a storage capacitor region;
a first conductive line formed in the data pad region;
a second conductive line formed in the storage capacitor region, a portion of the second conductive line functioning as a capacitor electrode of a storage capacitor;
a first switching element formed in a pixel region;
a first transparent layer including first and second transparent electrodes formed on the first and second conductive lines, respectively;
an insulating layer having a first contact hole extending to the first transparent electrode on the first conductive line in the data pad region and a second contact hole extending to a drain electrode of the first switching element in the pixel region;

an organic layer formed on the insulating layer, the organic layer having a first removed portion exposing the first transparent electrode in the data pad region and a second removed portion exposing the drain electrode of the first switching element in the pixel region; and a second transparent layer formed on the organic layer, the second transparent layer including a third transparent electrode directly connected to the first transparent electrode through the first contact hole in the data pad region and a fourth transparent electrode directly connected to the drain electrode through the second contact hole in the pixel region, wherein a portion of the organic layer in the storage capacitor region is removed, and the fourth transparent electrode extends to the storage capacitor region to be disposed directly on the insulating layer in the storage capacitor region, thereby forming the storage capacitor comprising the capacitor electrode, the second transparent electrode, a portion of the insulating layer in the storage capacitor region, and the fourth transparent electrode extending to the storage capacitor region.

2. The array panel of claim 1, further comprising a gate driver formed in the gate driver region, wherein the gate driver includes a plurality of stages sequentially making an electrical contact with each other, each stage including an input terminal and an output terminal through which corresponding signals are transmitted, a start signal being transmitted to the input terminal of a first stage, and an output signal of each stage being sequentially outputted from each output terminal, so that the stages function as a shift register.

3. The array panel of claim 1, wherein at least one of the first, second, third and fourth transparent electrodes comprises indium tin oxide (ITO).

4. The array panel of claim 1, wherein the fourth transparent electrode covers a whole of the first switching element in the pixel region.

5. The array panel of claim 1, further comprising a second switching element in the gate driver region, wherein the second transparent layer further includes a transparent pattern disposed on a portion of the organic layer in the gate driver region to cover a whole of the second switching element in the gate driver region.

6. The array panel of claim 1, further comprising a photoelectric cell for generating electrons in proportion with the intensity of light supplied from outside, thereby generating an electrical signal.

7. A method of manufacturing an array panel, the method comprising:

forming a first switching element in a pixel region, a second switching element in a gate driver region, a first conductive line in a data pad region and a second conductive line in a storage capacitor region, wherein a portion of the second conductive line functions as a capacitor electrode of a storage capacitor;

forming a first transparent layer on the first and second conductive lines to form first and second transparent electrodes on the first and second conductive lines, respectively;

sequentially coating an insulating layer and an organic layer to cover the first and second transparent electrodes, and to cover the first and second switching elements;

exposing a portion of the organic layer to light and developing the organic layer to remove a portion of the organic layer over the first transparent electrode and a portion of the organic layer over a drain electrode of the first switching element, and to remove a portion of the organic layer in the storage capacitor region;

removing a portion of the insulating layer to form a first contact hole extending to the first transparent electrode on the first conductive line and form a second contact hole extending to the drain electrode of the first switching element; and forming a second transparent layer on the organic layer, and patterning the second transparent layer to form a third transparent electrode directly connected to the first transparent electrode in the data pad region and form a fourth transparent electrode directly connected to the drain electrode, wherein the fourth transparent electrode extends to the storage capacitor region to be disposed directly on the insulating layer in the storage capacitor region, thereby forming the storage capacitor comprising the capacitor electrode, the second transparent electrode, a portion of the insulating layer in the storage capacitor region, and the fourth transparent electrode extending to the storage capacitor region.

8. The method of claim 7, further comprising:

forming a protecting layer on the organic layer and the patterned second transparent layer;

forming a light conductive semiconductor layer on the protecting layer; and forming an electrode on the light conductive semiconductor layer.

9. The method of claim 7, wherein the fourth transparent electrode covers a whole of the first switching element.

10. The method of claim 7, wherein the second transparent layer is patterned to be disposed on a portion of the organic layer in the gate driver region and to cover a whole of the second switching element.

11. The method of claim 7, wherein the second switching element is a plurality of thin film transistors comprising amorphous silicon, said plurality of thin film transistors arranged in a plurality of stages sequentially making an electrical contact with each other, and each stage including an input terminal and an output terminal through which corresponding signals are transmitted, a start signal being transmitted to the input terminal of a first stage, and an output signal of each stage being sequentially outputted from each output terminal, so that the stages function as a shift register.

* * * * *